US009196749B1

(12) United States Patent
Sardana et al.

(10) Patent No.: US 9,196,749 B1
(45) Date of Patent: Nov. 24, 2015

(54) PROGRAMMABLE DEVICE WITH A METAL OXIDE SEMICONDUCTOR FIELD EFFECT TRANSISTOR

(75) Inventors: Charu Sardana, San Jose, CA (US); Albert Ratnakumar, San Jose, CA (US); Qi Xiang, San Jose, CA (US); Bradley Jensen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 238 days.

(21) Appl. No.: 13/341,310

(22) Filed: Dec. 30, 2011

(51) Int. Cl.
*H01L 29/66* (2006.01)
*H01L 29/788* (2006.01)
*H01L 27/112* (2006.01)

(52) U.S. Cl.
CPC ...... *H01L 29/7881* (2013.01); *H01L 27/11206* (2013.01)

(58) Field of Classification Search
CPC ............ H01L 27/11206; H01L 27/115; H01L 29/7841; H01L 29/7881; H01L 29/7887; H01L 29/7923; H01L 29/804

USPC ......... 257/225, 260, 300, 297, 314, 338, 544, 257/E27.001, E27.084, E27.085, E27.098, 257/E27.102, E27.103, 107, 133, 134
See application file for complete search history.

(56) References Cited

U.S. PATENT DOCUMENTS

| 4,855,955 | A  | * | 8/1989 | Cioaca .................... 365/185.19 |
| 6,392,275 | B1 | * | 5/2002 | Jang ................................ 257/343 |
| 2006/0091470 | A1 | * | 5/2006 | Noguchi et al. ............... 257/369 |
| 2007/0228474 | A1 | * | 10/2007 | Takeuchi ....................... 257/355 |
| 2009/0127660 | A1 | * | 5/2009 | Kim et al. ..................... 257/578 |

* cited by examiner

*Primary Examiner* — Galina Yushina
(74) *Attorney, Agent, or Firm* — Womble Carlyle Sandridge & Rice, LLP (57) ABSTRACT

A programmable device with a metal oxide semiconductor field effect transistor (MOSFET) surrounded by a programmable substrate region is described. The MOSFET has a source and drain region separated by a channel region with an insulating region and gate disposed above the channel region. A junction disposed within the substrate region controls the programmable substrate region. Biasing the junction depletes the substrate region, which isolates the body of the MOSFET from a secondary well. When the junction is left unbiased, the body of the MOSFET is electrically coupled to the secondary well.

20 Claims, 6 Drawing Sheets

PROGRAMMABLE DEVICE WITH A METAL OXIDE SEMICONDUCTOR FIELD EFFECT TRANSISTOR

BACKGROUND

The demand for low power and high performance digital systems continues to steadily increase. These digital systems consist of, among other devices, programmable logic devices (PLDs), field programmable gate arrays (FPGAs), and application specific integrated circuits (ASICs). Within each device are hundreds, if not thousands, of insulated gate field effect transistors (IGFETs), such as metal-oxide semiconductor field effect transistors (MOSFETs). In order to meet modern performance standards, these transistors must have high-bandwidth. Furthermore, as the density of these devices increases, the number of transistors on the substrate increases, and power consumption becomes critical. At the same time, portable high performance digital systems have become increasingly smaller. As these systems continue to get smaller, their ability to dissipate power becomes severely constrained.

Traditionally, designers scale down the supply voltage in order to decrease power consumption. However, as supply voltage decreases, the threshold voltage of the transistor must also be reduced in order to not significantly impair circuit speed. As the threshold voltage decreases, the leakage current in the off state increase, leading to an increase in the idle power consumption of the transistor. Therefore, power consumption of the transistor is bound by a lower limit, which cannot be altered with power supply scaling.

Furthermore, attempts to increase transistor performance have yielded mixed results. Typically, the body of the transistor is grounded or connected to the source region of the device. If the body of the transistor is left floating or unbiased, charges are allowed to accumulate within the body of the transistor, which turns on the inherent parasitic bipolar junction transistor (BJT). When the BJT is on, the transistor is able to source more current, which improves performance. However, these charges remain trapped within the body of the transistor creating a memory effect, which causes the device to behave differently every time the device is turned on.

SUMMARY

Broadly speaking, the embodiments fill these needs by providing a method and apparatus for a programmable device. In one embodiment, the programmable device is implemented by surrounding the body of a MOSFET with a programmable substrate region. This substrate region can either isolate the body of the MOSFET from a secondary well, or electrically couple the body of the MOSFET with the secondary well. A junction, or diode, disposed within the substrate region controls the programmable substrate region. It should be appreciated that the present invention can be implemented in numerous ways, including as a method, a system, or a device.

In accordance with one embodiment of the invention, a programmable device is implemented by isolating the body of a MOSFET with a programmable substrate region on two sides, and a guard ring on the other two sides. The substrate region isolates the body of the MOSFET from a secondary well. A junction disposed within the substrate region controls the substrate region to either couple the body of the MOSFET with the secondary well, or isolate the body of the MOSFET from the secondary well.

In accordance with one embodiment of the invention, a method for controlling the programmable device is implemented by biasing the junction disposed within the substrate region. When the junction is left unbiased, the body of the MOSFET is electrically coupled with the secondary well and the tap disposed within the secondary well. In one embodiment, the body of the MOSFET is grounded which removes any charges that may have accumulated in the body of the MOSFET. When the junction is biased, the substrate region isolates the body of the MOSFET allowing charges to accumulate.

Other aspects and advantages of the embodiments will become apparent from the following detailed description, taken in conjunction with the accompanying drawings, illustrating by way of example the principles of the embodiments.

BRIEF DESCRIPTION OF THE DRAWINGS

The embodiments, together with further advantages thereof, may best be understood by reference to the following description taken in conjunction with the accompanying drawings.

DETAILED DESCRIPTION

The following embodiments describe an apparatus and method for creating a programmable, low-power, high-performance field effect transistor. It will be obvious, however, to one skilled in the art, that the present invention may be practiced without some or all of the details. In other instances, well known process operations have not been described in detail in order not to unnecessarily obscure embodiments.

Embodiments described below disclose a high-speed programmable transistor that consumes low-power in the off state. These embodiments of the present invention allow designers to use the transistor in multiple configurations maximizing efficiency and flexibility. In one configuration, the programmable device can be used as a metal oxide semiconductor field effect transistor (MOSFET) to minimize power consumption. In another configuration, the programmable device can be used as a floating body transistor to increase output current in order to maximize performance.

Figure 1:
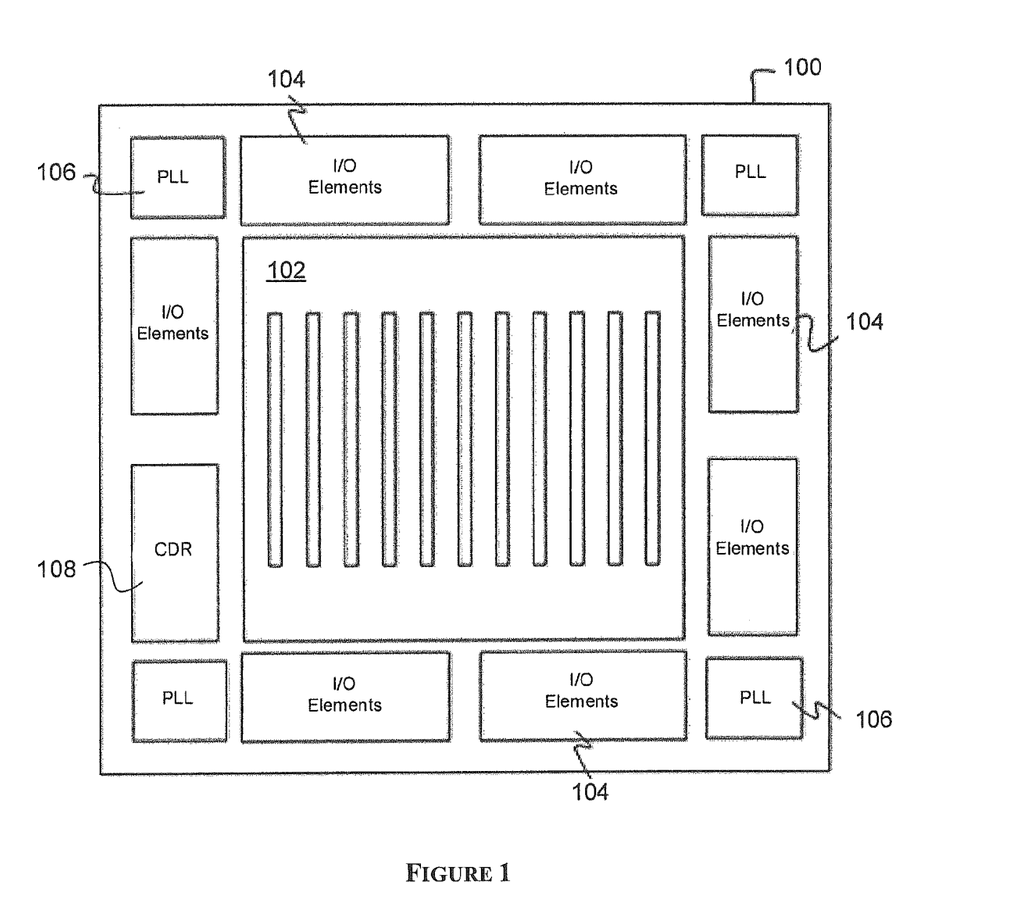
FIG. 1 illustrates a simplified block diagram of a programmable logic device (PLD) that can include aspects of the present invention.

FIG. 1 illustrates a simplified block diagram of a programmable logic device (PLD) that can include aspects of the present invention. Programmable logic device 100 includes core logic region 102 and input/output (I/O) elements 104.

Auxiliary circuits such as phase-locked loops (PLLs) 106 for clock generation and timing, can be located outside the core logic region 102, e.g., at corners of the programmable logic device 100 and adjacent to I/O elements 104. Logic region 102 may be populated with logic cells which include logic elements. The logic elements and groups of logic elements can be configured to perform logical functions desired by the user. In one embodiment, the PLD 100 may further include clock data recovery circuits (CDRs) 108. CDRs 108

Figure 2A:
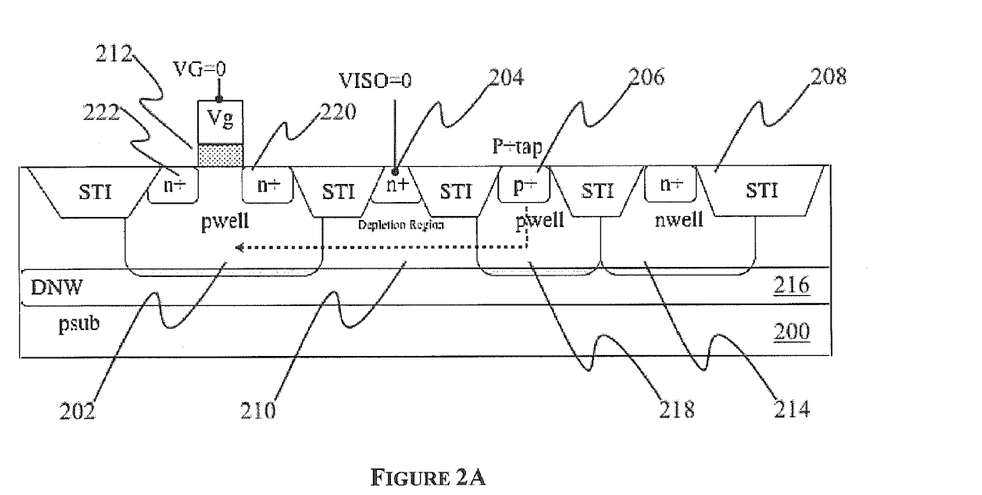
FIG. 2A illustrates a simplified cross section of a programmable device in the off state, in accordance with one embodiment of the present invention.

FIG. 2A illustrates a simplified cross section of a programmable device in the off state, in accordance with one embodiment of the present invention. This device may be found in I/O elements 104, or inside the core logic region 102 of FIG. 1. In accordance with this embodiment of the present invention, the device includes a primary p-type well 202, programmable p-type substrate region 210, and secondary p-type well 218, all disposed above a deep n-type well 216. The primary well 202 forms the body of a p-channel MOSFET with a n-type source region 220, and a n-type drain region 222 disposed within the primary well 202. An insulating layer and gate 212 complete the MOSFET's components, and are disposed over the channel separating source region 220 and drain region 222.

A n-type region 204 is disposed within the programmable substrate region to create a junction, also referred to as a diode. Additionally, a p-type region 206 is disposed within the secondary well 218 to create a tap. Finally, several shallow tenches 208 are etched between the primary well 202 and the programmable substrate region 210, the programmable substrate region 210 and the secondary well 218, and the secondary well 218 and the guard ring 214, in order to provide electrical isolation. When the voltage applied to junction 204 is low, or the junction 204 is unbiased, the depletion depth within the programmable substrate region 210 does not completely extend to the deep well 216. Thus, under these conditions, the programmable substrate region 210 electrically couples the secondary well 206 to the primary well 202, or the body of the MOSFET.

In one embodiment of the present invention, tap 206 can be coupled with ground. When the voltage applied to junction 204 is low, as discussed above, the programmable substrate region 210 couples the primary well 202, or body of the MOSFET, to ground. Under these conditions, the programmable device functions similar to a MOSFET. Leakage current, or the charges drifting from source region 220 to drain region 222, of the programmable device is minimized in this state. Therefore, the programmable device does not consume more power in the idle state than a MOSFET. Furthermore, this configuration can be used to ground the primary well 202, thus removing any charges that may have accumulated within the body of the MOSFET 202. There is no longer the potential for any memory effect in the programmable device, as holes cannot be trapped within the body of the MOSFET 202.

Figure 2B:
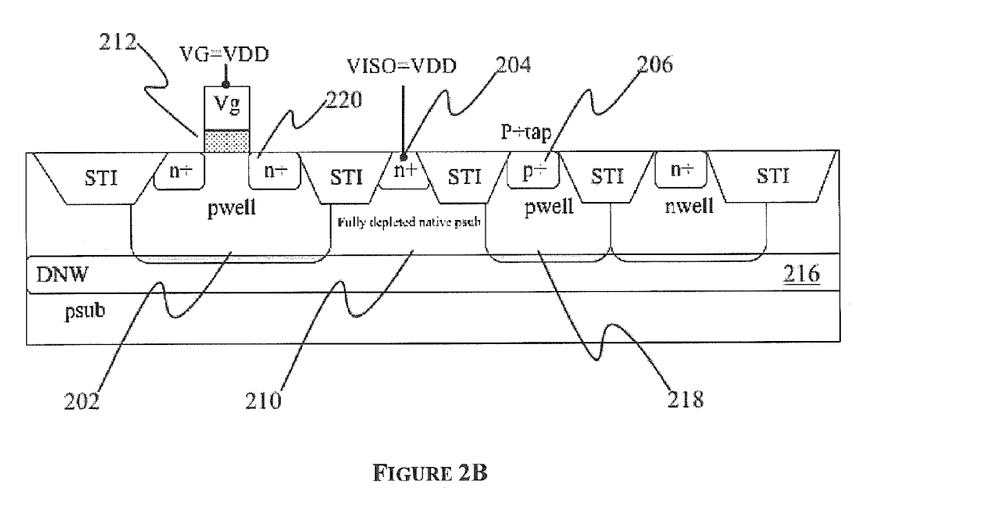
FIG. 2B illustrates a simplified cross section of a programmable device in the on state, in accordance with one embodiment of the present invention.

FIG. 2B illustrates a simplified cross section of a programmable device in the on state, in accordance with one embodiment of the present invention. In this state, junction 204 is connected to a high voltage source, or junction 204 is forward biased. In one embodiment, the high voltage source can be the supply power voltage for the programmable device. When the programmable device is in this state, the depletion region within the programmable substrate region 210 extends to the deep well 216, thereby isolating primary well 202, or body of the MOSFET, from the secondary well 218.

Since the body of the MOSFET 202 is completely isolated in this state, the body 202 is now floating. When the body 202 is floating, holes that are generated cannot escape, and become accumulated within the body 202. Once the body 202 is sufficiently charged, the source 220-body 202 junction becomes forward biased and the parasitic bipolar junction transistor (BJT) inherent in the MOSFET turns on. The BJT allows the body 202 to carry more holes, increasing the output current of the MOSFET. An increase in output current yields a higher drive strength leader to a quicker response time, therefore allowing the programmable device to operate at higher frequencies. Actual silicon data confirms that this apparatus increases output current by approximately 10%.

In one embodiment of the present invention, the programmable device can be controlled by coupling junction 204 with gate 212. Furthermore, tap 206 is coupled with ground in this embodiment. When the voltage applied to gate 212 is low, the MOSFET is off. Since junction 204 is coupled with gate 212, a low voltage is also applied to junction 204, which effectively grounds the body of the MOSFET 202, removing any charge that may have accumulated in the body 202. When the voltage applied to gate 212, is high (i.e. the supply power voltage in one embodiment), the MOSFET turns on. Since junction 204 is coupled with gate 212, a high voltage is also applied to junction 204, which isolates the body of MOSFET 202 from the secondary well 218. One skilled in the art will recognize that the body of MOSFET 202 is now floating, and the BJT will turn on, increasing output current. In this embodiment, the body 202 is always grounded when the programmable device is in the off state. On the other hand, the body 202 is always floating when the programmable device is in the on state. By using the device in this configuration, designers can take advantage of the floating body effect to increase output current without increasing idle power consumption.

Figure 3:
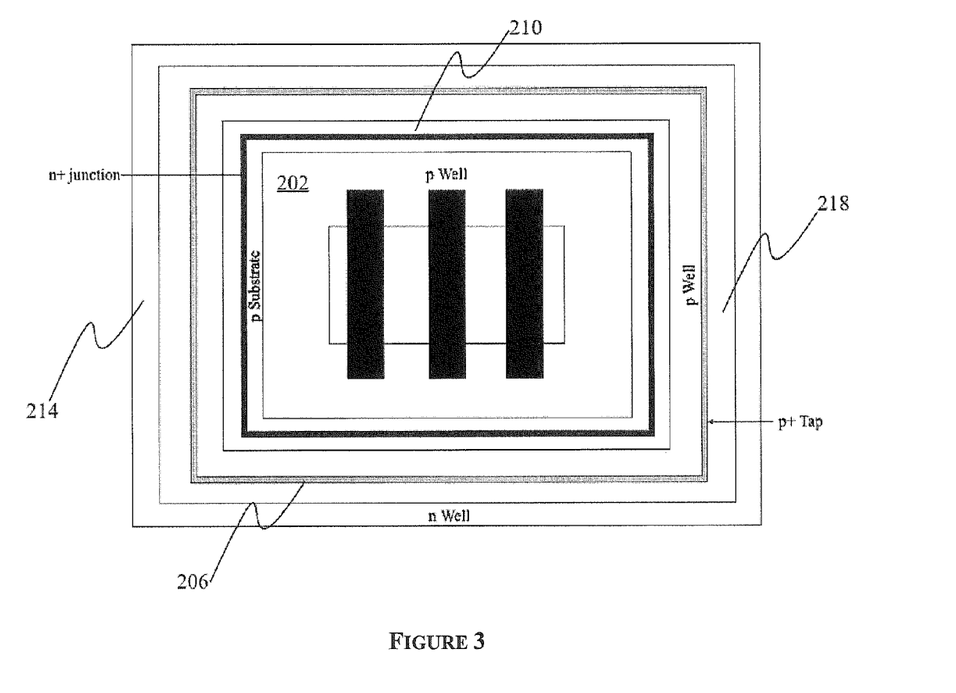
FIG. 3 illustrates a simplified top view of a programmable device, in accordance with one embodiment of the present invention.

FIG. 3 illustrates a simplified top view of a programmable device, in accordance with one embodiment of the present invention. The top view shows that the programmable substrate region 210 surrounds the primary well 202, or body of the MOSFET. When the substrate region 210 is partially depleted, the body of the MOSFET 202 becomes electrically coupled with the secondary well 218. In one embodiment, the tap 206 disposed within the secondary well 218 is coupled with ground, which electrically grounds the body of the MOSFET 202. On the other hand, when the substrate region 210 is fully depleted, the substrate region 210 completely isolates the body of the MOSFET 202. Under these conditions, charges are allowed to accumulate within the body of the MOSFET 202, which increases the performance of the MOSFET. The outer guard ring 214 isolates the programmable device from other devices that can be on the substrate 200 as illustrated in FIG. 2A.

Figure 4:
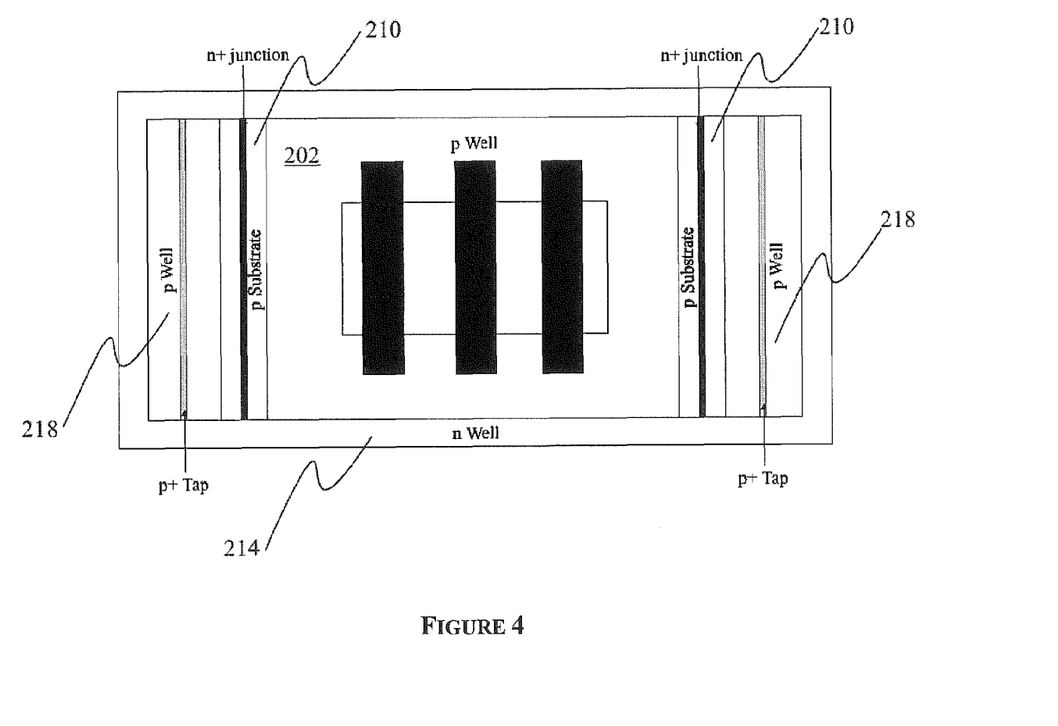
FIG. 4 illustrates a simplified top view of a programmable device, in accordance with another embodiment of the present invention.

FIG. 4 illustrates a simplified top view of a programmable device, in accordance with another embodiment of the present invention. To conserve space, in one embodiment the substrate region 210 and the secondary well 218 can be trimmed to be on two sides of the primary well 202. In this embodiment, the guard ring 214 isolates the other two sides of the primary well 202 from other electrical devices that can also be on substrate 200 shown in FIG. 2A. The well to well spacing is a maximum of 0.24 micrometers in one embodiment. By eliminating the programmable substrate region 210, and accompanying secondary well 218 on two sides of the primary well 202, over 0.5 micrometers may be saved. In this embodiment of the invention, the substrate region 210 can be programmed to isolate or couple the primary well 202 with the secondary well 218. In this respect, the embodiment illustrated in FIG. 4 performs the same as the embodiment illustrated in FIG. 3, but requires less space.

Figure 5:
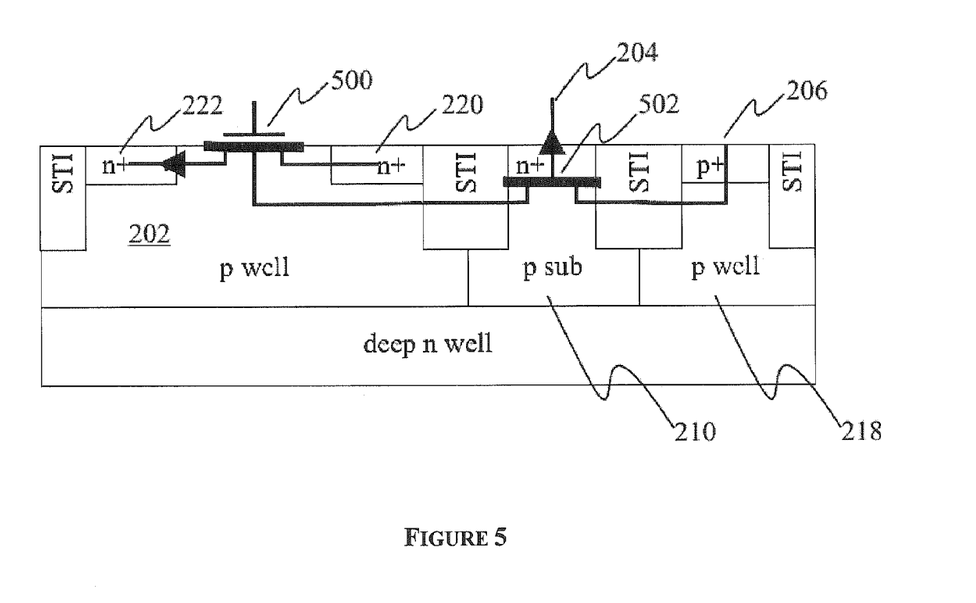
FIG. 5 illustrates a simplified circuit equivalent of a programmable device, in accordance with one embodiment of the present invention.

FIG. 5 illustrates a simplified circuit equivalent of a programmable device, in accordance with one embodiment of the present invention. The primary well 202 with corresponding source region 220 and drain region 222 can be modeled as a MOSFET 500. Furthermore, the programmable substrate region 210 and junction 204 can be modeled as being a part of a junction field effect transistor (JFET) 502. In this embodiment, the JFET 502 acts as a controllable switch, which can connect the body of the MOSFET 500 to the secondary well 218 and tap 206. When tap 206 is connected to ground, the JFET 502 controls an electrical connection between the body of the MOSFET 500 and ground.

In one embodiment, the gate of the JFET 502 can be left off, or unbiased. In this state, the JFET 502 allows current to flow between the body of the MOSFET 500, and the secondary well 218. Thus, the body of the MOSFET 500 is electrically coupled with the secondary well 218, which grounds the body of MOSFET 500. On the other hand, the JFET 502 can be turned on, or forward biased, to impede the current between the body of the MOSFET 500 and the secondary well 218. When the JFET 502 is on, the body of the MOSFET 500 left floating, which allows charges to accumulate. Therefore, the JFET 502 can be programmed to isolate the body of the MOSFET 500 in order to increase the output current of MOSFET 500, or it can be programmed to couple the body of the MOSFET 500 with ground to remove any charges that may have accumulated within the body of the MOSFET 500.

Figure 6:
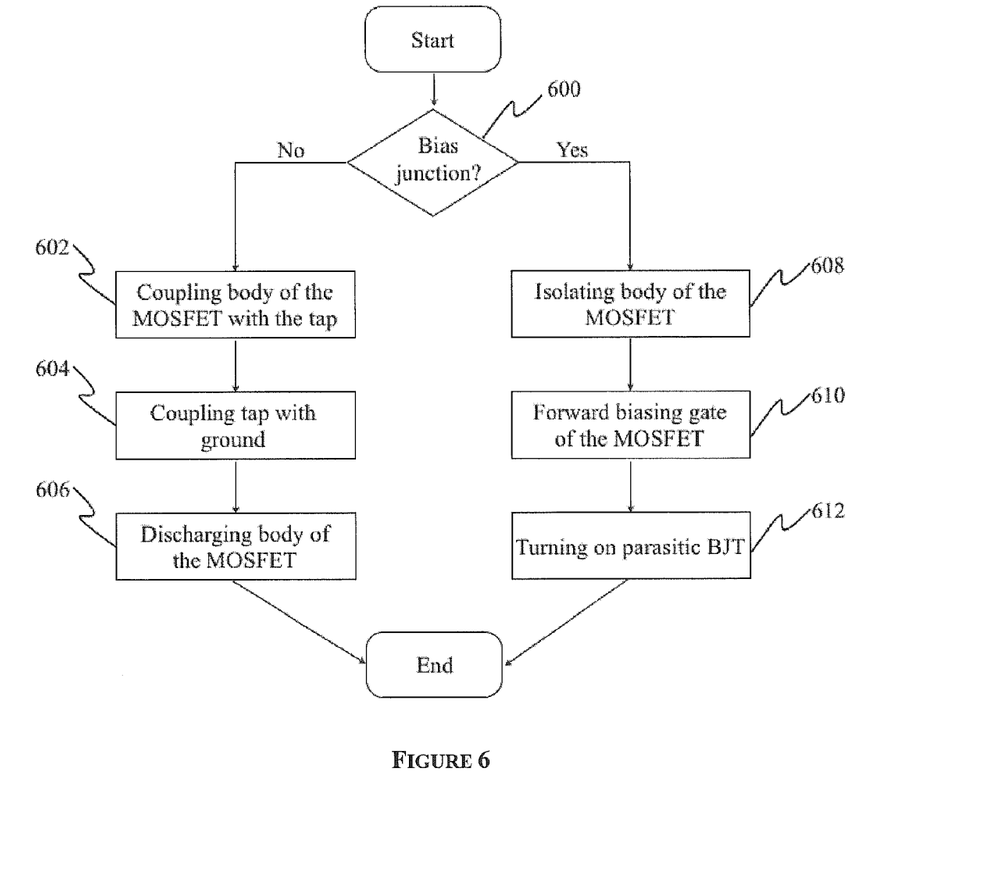
FIG. 6 illustrates a simplified block diagram of a method for controlling the programmable device, in accordance with one embodiment of the present invention.

FIG. 6 illustrates a simplified block diagram of a method for controlling the programmable device, in accordance with one embodiment of the present invention. The method begins with decision box 600, in which the junction as illustrated by node 204 in FIG. 5 can be either biased or unbiased. When the junction 204 in FIG. 5 is left unbiased, the method advances to operation 602. During this operation, the body of the MOSFET, as illustrated by node 202 in FIG. 5, is coupled with the tap shown as node 206 in FIG. 5. In one embodiment, the tap 206 in FIG. 5 is coupled to ground as shown by operation 604. Once the tap 206 in FIG. 5 is coupled to ground, the method advances to operation 606, where the body of the MOSFET, as illustrated by node 202 in FIG. 5, is discharged. At this point all charges that may have accumulated within the body of the MOSFET 202 in FIG. 5 have been removed ensuring that there is no memory effect, and the method terminates.

Returning to decision box 600, junction 204, as illustrated by node 204 in FIG. 5, can be biased and the method advances to operation 608. In operation 608, the body of the MOSFET 202 in FIG. 5 becomes electrically isolated from the secondary well, illustrated by node 218 in FIG. 5 and any other device that could be on the substrate shown by node 200 in FIG. 2A. The method advances to operation 610, where the gate of the MOSFET 500 in FIG. 5 is forward biased, which turns the MOSFET 500 in FIG. 5 on. Since the body of the MOSFET 202 in FIG. 4 is floating charges are allowed to accumulate with the body. Eventually these charges forward bias the source-body region of the MOSFET 500 in FIG. 5 and turn on the parasitic BJT in operation 612. At this point the output current of the MOSFET 500 in FIG. 5 increases, and hence performance, and the method terminates.

The method and apparatus herein may be incorporated into any suitable circuit, including processors and programmable logic devices (PLDs). The PLDs can include programmable logic arrays (PLAs), field programmable logic array (FPLAs), electrically programmable logic devices (EPLDs), electrically erasable programmable logic devices (EEPLDs), logic cell arrays (LCAs), field programmable gate arrays (FPGAs), application specific standard products (ASSPs), just to name a few.

The programmable logic device described herein may be part of a data processing system that includes on or more of the following components; a processor; memory; I/O circuitry; and peripheral devices. The data processing system can be used in a wide variety of application, such as computer networking, data networking, instrumentation, video processing, digital signal processing, or any suitable other application where the advantage of using programmable or reprogrammable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the PLDs owned by the assignee.

The embodiments may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A programmable device comprising:
   a first well having a top surface and a bottom surface, the first well of a first conductivity type;
   a transistor having a source region of a second conductivity type within the first well, a drain region of the second conductivity type within the first well, an insulating layer disposed over the top surface of the first well, and a gate disposed over the insulating layer;
   a substrate region surrounding the first well, having a top surface and a bottom surface, the substrate region of the first conductivity type;
   a junction of the second conductivity type disposed within the substrate region;
   a second well surrounding the substrate region, the second well having a top surface and a bottom surface, the second well of the first conductivity type, wherein the junction, the first well and the second well are included as portions of a junction field effect transistor (JFET); and
   a guard ring surrounding the second well, the guard ring having a top surface and a bottom surface, the guard ring of the second conductivity type.

2. The device as recited in claim 1 further comprising: a third well of the second conductivity type having a top and a bottom surface, the third well extending below the bottom surfaces of the first well, the substrate region, the second well, and the guard ring.

3. The device as recited in claim 2 further comprising: a substrate of the first conductivity type extending below the bottom surface of the third well.

4. The device as recited in claim 3 further comprising: a tap of the first conductivity type disposed within the second well.

5. The device as recited in claim 4 further comprising: at least one trench between the first well and the substrate region, between the substrate region and the second well, or between the second well and the guard ring.

6. The device as recited in claim 1, wherein the junction is configured to reverse bias and deplete the substrate region, thereby isolating the transistor.

7. The device as recited in claim 1, wherein multiple transistors are arrayed within the first well.

8. The device as recited in claim 1, wherein the transistor is a p-channel MOSFET.

9. A programmable device comprising:
   a first well of a first conductivity type and a second well of the first conductivity type, the first well and the second well each having a bottom surface;
   a transistor having a source region of a second conductivity type within the first well, a drain region of the second conductivity type within the first well, an insulating layer disposed over the top surface of the first well, and a gate disposed over the insulating layer;
   a substrate region of the first conductivity type having a bottom surface, the substrate region disposed between the first well and the second well, the substrate region enabling an electrical connection between the first well and the second well;
   a diode disposed within the substrate region, wherein the first well, the second well, the substrate region and the diode form portions of a junction field effect transistor (JFET), the JFET configured as a controlled switch that connects and disconnects the first well to and from the second well; and
   a guard ring surrounding the first well, the substrate region, and the second well, the guard ring having a bottom surface, the guard ring of the second conductivity type.

10. The device as recited in claim 9 further comprising: a third well of the second conductivity type having a top surface and a bottom surface, the third well extending below the bottom surfaces of the first well, the substrate region, the second well, and the guard ring.

11. The device as recited in claim 10 further comprising: a substrate of the first conductivity type extending below the bottom surface of the third well.

12. The device as recited in claim 9 further comprising: a plurality of shallow trenches etched between the first well and the substrate region, between the substrate region and the second well, and between the second well and the guard ring, to provide electrical isolation.

13. The device as recited in claim 9, wherein the diode is constructed so that a voltage source reverse biases the diode to isolate the first well from the second well.

14. The device as recited in claim 9, wherein multiple transistors are arrayed within the first well.

15. The device as recited in claim 9, wherein the transistor is a p-channel MOSFET.

16. A programmable device comprising:
   a first well of a first conductivity type;
   a metal oxide semiconductor field effect transistor (MOSFET) having a source region of a second conductivity type within the first well, a drain region of the second conductivity type within the first well, an insulating layer disposed over the first well, and a gate disposed over the insulating layer;
   a substrate region surrounding the first well, the substrate region of the first conductivity type;
   a second well surrounding the substrate region, the second well of the first conductivity type; and
   a first region of the second conductivity type disposed within the substrate region, wherein a junction field effect transistor (JFET) is formed by the first well, the substrate region, the first region, and the second well.

17. The programmable device of claim 16, wherein the JFET is configured to connect a body of the MOSFET to the second well.

18. The programmable device of claim 16, wherein the JFET is configured to increase a current of the MOSFET.

19. The programmable device of claim 16, wherein the JFET is configured to remove charges that accumulate within a body of the MOSFET.

20. The programmable device of claim 16, wherein the JFET is configured to float a body of the MOSFET.

* * * * *